United States Patent
Telecco et al.

(10) Patent No.: US 7,180,779 B2
(45) Date of Patent: Feb. 20, 2007

(54) MEMORY ARCHITECTURE WITH ENHANCED OVER-ERASE TOLERANT CONTROL GATE SCHEME

(75) Inventors: Nicola Telecco, San Jose, CA (US); Victor Nguyen, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 58 days.

(21) Appl. No.: 11/178,965

(22) Filed: Jul. 11, 2005

(65) Prior Publication Data

US 2007/0008775 A1    Jan. 11, 2007

(51) Int. Cl.
  *G11C 11/34* (2006.01)
(52) U.S. Cl. .......................... 365/185.18; 365/185.17; 365/185.3; 365/185.33
(58) Field of Classification Search ........... 365/185.17, 365/185.18, 185.26, 185.3, 185.33, 185.02
  See application file for complete search history.

(56) References Cited

U.S. PATENT DOCUMENTS

| | | | | |
|---|---|---|---|---|
| 4,451,905 A * | 5/1984 | Moyer | .................... | 365/185.02 |
| 5,416,738 A * | 5/1995 | Shrivastava | ........... | 365/185.24 |
| 5,978,278 A * | 11/1999 | Lee | ........................ | 365/185.33 |
| 6,282,126 B1 | 8/2001 | Prall | ....................... | 365/185.3 |
| 6,381,670 B1 | 4/2002 | Lee et al. | .................... | 711/103 |
| 6,442,066 B1 | 8/2002 | Prall | ..................... | 365/185.01 |
| 6,549,463 B2 * | 4/2003 | Ogura et al. | ........... | 365/185.18 |
| 6,788,573 B2 * | 9/2004 | Choi | ..................... | 365/185.05 |
| 6,795,349 B2 * | 9/2004 | Cernea | ................... | 365/185.33 |
| 6,829,167 B2 * | 12/2004 | Tu et al. | ................. | 365/185.18 |
| 6,934,195 B2 * | 8/2005 | Cernea | ................... | 365/185.33 |
| 7,099,194 B2 * | 8/2006 | Tu et al. | ................. | 365/185.18 |
| 2002/0044483 A1 | 4/2002 | Prall | ..................... | 365/185.05 |

* cited by examiner

*Primary Examiner*—Anh Phung
*Assistant Examiner*—Alexander Sofocleous
(74) *Attorney, Agent, or Firm*—Schneck & Schneck; Thomas Schneck

(57) ABSTRACT

The present invention is related to semiconductor memories, and in particular, to a nonvolatile or flash memory and method that reduces the effect of or is tolerant of over-erased memory cells. When a memory cell is read, a read voltage is applied to at least one target memory cell, and a negative bias voltage that is lower than a threshold voltage of an over-erased memory cell is also applied to at least one other selected memory cell that is in the same row as the target memory cell. Applying a negative bias voltage to adjacent or proximate memory cells shuts off nearby cells to isolate current that may come from over-erased memory cells during a read, program, or erase operation.

19 Claims, 3 Drawing Sheets

MEMORY ARCHITECTURE WITH ENHANCED OVER-ERASE TOLERANT CONTROL GATE SCHEME

TECHNICAL FIELD

The present invention is related to semiconductor memories, and in particular, a nonvolatile or flash memory that reduces the effect of or is tolerant of over-erased memory cells.

BACKGROUND ART

In flash memory operation, a logical state of a memory cell is governed by an electron charge stored on an electrically isolated floating gate. A sensing operation is performed to determine an amount of charge stored which represents a stored data value. The charge that is present on the floating gate is retained over time, due to the inherent nature of an energy barrier or oxide layer surrounding the floating gate, and the accuracy of the amount of charge stored is critical so the represented data remain accurate and reliable. Accuracy also becomes even more important for multiple state or multiple data bit memory cells.

Fowler-Nordheim Tunneling and channel hot electron injection are methods used to erase and/or program a flash memory cell. Because a large number of memory cells are normally erased using block erase schemes, memory cells having faster erase speeds may become over erased, while memory cells having slower erase speeds may not successfully erase. Various threshold voltage distributions exist representing different stored states in a memory cell. A first threshold voltage for a normally erased memory cell is generally centered at or slightly above zero Volts, and a second threshold voltage for a programmed memory cell is generally centered approximately at or above 2 Volts. However, the threshold voltage for an over-erased memory cell is generally centered below zero Volts. When an over-erased condition occurs, zero Volts is no longer below the threshold voltage of the over-erased memory cell. If the over-erased condition of a memory cell is not remedied, the over-erased memory cells will conduct leakage current in other areas of the memory array causing sense amplifier or bit line malfunctions as well as other operational errors.

A common approach to dealing with the issue of over-erased memory cells, after an over-erase condition occurs, is to use an erase recovery procedure. The erase recovery procedure is typically executed by a memory controller circuit or microprocessor, to remedy the negative threshold voltage shift. The recovery procedure changes an over-erased threshold voltage to a normally erased threshold voltage. A typical procedure utilizes a program pulse, applied at a low voltage level, to partially program an over-erased memory cell and rectify its negative threshold voltage. To accomplish an effective partial programming pulse that can rectify the over-erased memory cell's negative threshold voltage to just within the desired erased cell boundary requires very high accuracy. Also, implementing an erase recovery procedure introduces the potential of entering an infinite recovery and erase loop.

Alternate approaches have also been devised to reduce or eliminate possible over-erased memory cells. For example, U.S. Pat. No. 6,442,066 to Prall entitled "Flash Memory With Overerase Protection" reduces over-erase errors. However, Prall must provide isolation transistors in each row of the memory array. U.S. Pat. No. 6,381,670 to Lee et al. entitled "Flash Memory Array Having Maximum And Minimum Threshold Voltage Detection For Eliminating Over Erasure Problem And Enhancing Write Operation" reduces over-erase errors but must apply a negative voltage to a word line, affecting the entire row of memory cells. Both Prall and Lee only select an entire word line or a row of memory cells in a memory array and cannot isolate individual regions or areas smaller than a row within the memory array.

SUMMARY OF THE INVENTION

An exemplary embodiment of the present invention provides a method and memory device to reduce or prevent the effect of an over-erasure of nonvolatile memory cells. A plurality of nonvolatile memory cells is arranged in an array of rows and columns. When a memory cell is read, a read voltage is applied to at least one target memory cell, and a negative bias voltage that is lower than a threshold voltage of an over-erased memory cell is also applied to at least one other selected memory cell that is in the same row as the target memory cell.

An advantage of the present invention eliminates the requirement that a memory controller or a microcontroller identify and run a recovery operation for each individual over-erased memory cell, thus reducing the number of instructions stored in the microcontroller. Additionally, the present invention improves the ability of the memory circuits to tolerate over-erased memory cells, allows the application of programming voltages having wider operating windows, and provides faster overall erase times. Also, a greater separation of threshold voltages between a programmed memory cell and an erased cell provides an increased margin for differentiating stored states in a memory cell.

DETAILED DESCRIPTION OF THE INVENTION

In an exemplary memory array, a number of nonvolatile memory cells are arranged in an array of rows and columns. The memory array includes word lines coupled to the gates of memory cells in a row, or coupled to control devices that are coupled to the memory cells. Word lines are generally used to select a row of memory cells within a memory array. Bit lines are generally coupled to drains or sources of memory cells in columns and are selectively coupled to sense circuits to determine the stored state in a memory cell. A single memory cell is selected at the crossing location of a word line or row, in conjunction with a bit line or column.

Figure 1:
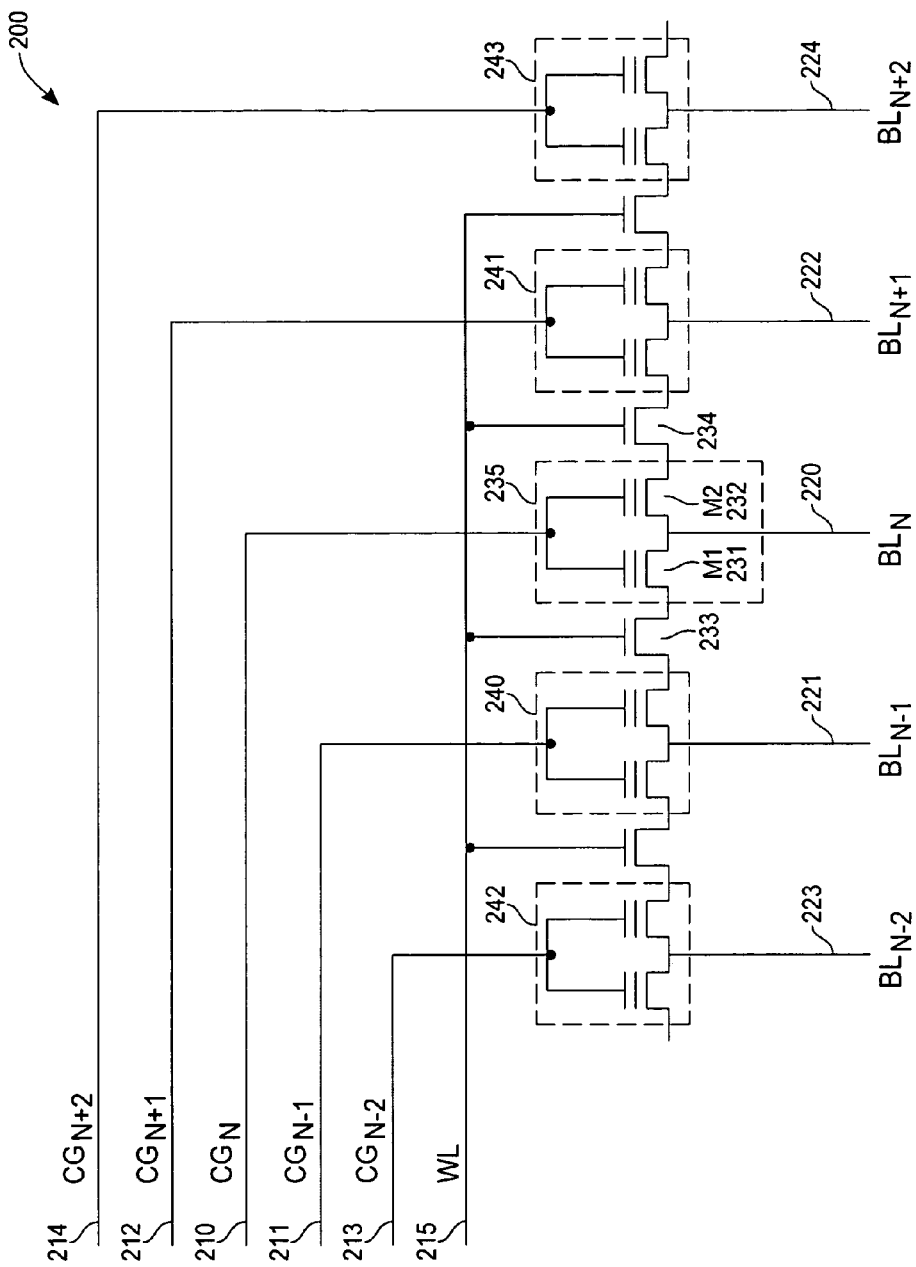
FIG. 1 is an exemplary circuit diagram of a MONOS memory array.

Referring to FIG. 1, an exemplary circuit diagram 200 of a twin MONOS (metal-oxide-nitride-oxide-semiconductor) type memory array row contains a plurality of nonvolatile memory cells. A twin MONOS memory unit 235 is comprised of two separate memory cells, such as M1 231, and M2 232, each having a common control gate signal, such as $CG_N$ 210, that drives both memory cells. A (sensing) bit line $BL_N$ 220 is coupled to the M1/M2 common source/drain. Independent word line selection devices 233, 234 are coupled between adjacent twin MONOS memory units. During a read, program, or erase operation, a memory unit containing a pair of memory cells is selected. The memory states of the two memory cells M1 231, and M2 232 will be read on the two sensing bit lines $BL_{N-1}$ 221, $BL_{N+1}$ 222 coupled through the word line WL 215 selection devices 233, 234. For example, in one sense bit line path for memory cell M1 231, current will flow between $BL_{N-1}$ 221 and $BL_N$ 220, which can be biased to ground. For adjacent memory cell M2 232, current will flow between $BL_{N+1}$ 222 and $BL_N$ 220.

Prior to a read, program, or erase operation, the memory array will typically operate in a resting state and have all of the control gate lines 210–214 and bit lines 220–224 biased to ground, and the word line WL 215 coupled to ground. Sense circuits (not shown) will be coupled to bit lines 220–224 to read the state of a selected memory cell.

In one embodiment of the present invention, during a read operation for a selected (or target) memory cell (for example, M1 231), a read voltage is coupled to the control gates of the memory cell pair M1 231 and M2 232 via the control gate line $CG_N$ 210. A service read voltage is also coupled to the adjacent memory units, or memory cell pairs 240, 241 via the adjacent control gate lines $CG_{N-1}$ 211 and $CG_{N+1}$ 212. Default voltages for the CG lines 210–214 are typically coupled to ground. However, the "read" voltage on the control gate $CG_N$ 210 must be set typically below $V_{dd}$, (or below the lowest possible threshold voltage of any programmed cell in the array), while the "service read" voltage on control gates $CG_{N+1}$ 212 & $CG_{N-1}$ 211 must be set typically above $V_{dd}$, (or above the highest possible threshold voltage of any programmed cell in the array). In this embodiment, when the memory is operated with a VDD of approximately 1.4 to 2.0 volts, the read voltage generally operates in the range of 1.4 to 2.0 volts, and the service read voltage generally operates in the range of 3.6 to 4.5 volts.

The bit line $BL_N$ 220 coupled to M1 231, is then coupled to ground, and adjacent bit lines $BL_{N-1}$ 221, $BL_{N+1}$ 222, currently at $V_{DD}$, are floated and then coupled to the sense circuits. To select a row containing at least one selected memory cell, a selected word line is set to the read voltage of approximately 1.6 to 2.0 volts. The adjacent bit lines $BL_{N-1}$ 221, $BL_{N+1}$ 222, either remain at approximately VDD or fall in voltage depending on the threshold voltage of the selected memory cells M1 231, and M2 232. Although two memory cells are selected simultaneously, the signal on the two adjacent sensing bit lines $BL_{N-1}$ 221, $BL_{N+1}$ 222 will develop independently of each other. For example, when both memory cells M1 231, and M2 232 have stored a "1" or high logic state, current will flow from the bit lines $BL_{N-1}$ 221, $BL_{N+1}$ 222 through the memory cells M1 231, and M2 232, and through the common bit line $BL_N$ 220.

When a neighboring memory cell in an adjacent memory unit 240, 241 or a proximate memory unit 242, 243 has been over erased, additional unwanted current may flow in adjacent bit lines $BL_{N-2}$ 223, $BL_{N+2}$ 224, affecting the amount of current flowing in the sense circuit coupled bit lines $BL_{N-1}$ 221, $BL_{N+1}$ 222. To counter the effect of a possible over-erased memory cell having a threshold voltage below zero volts, adjacent and proximate memory cells are biased with a negative voltage to reliably assure that an over-erased memory cell will shut off or remain off. The negative bias voltage is selected so it is approximately below the threshold voltage of an over-erased memory cell and may be in the range of −0.5 to −2.0 volts. The application of a negative bias voltage to selected proximate or adjacent control gate lines isolates and protects a selected (or addressed) memory cell from undesired current flow or charge from an over-erased memory cell.

Figure 2:
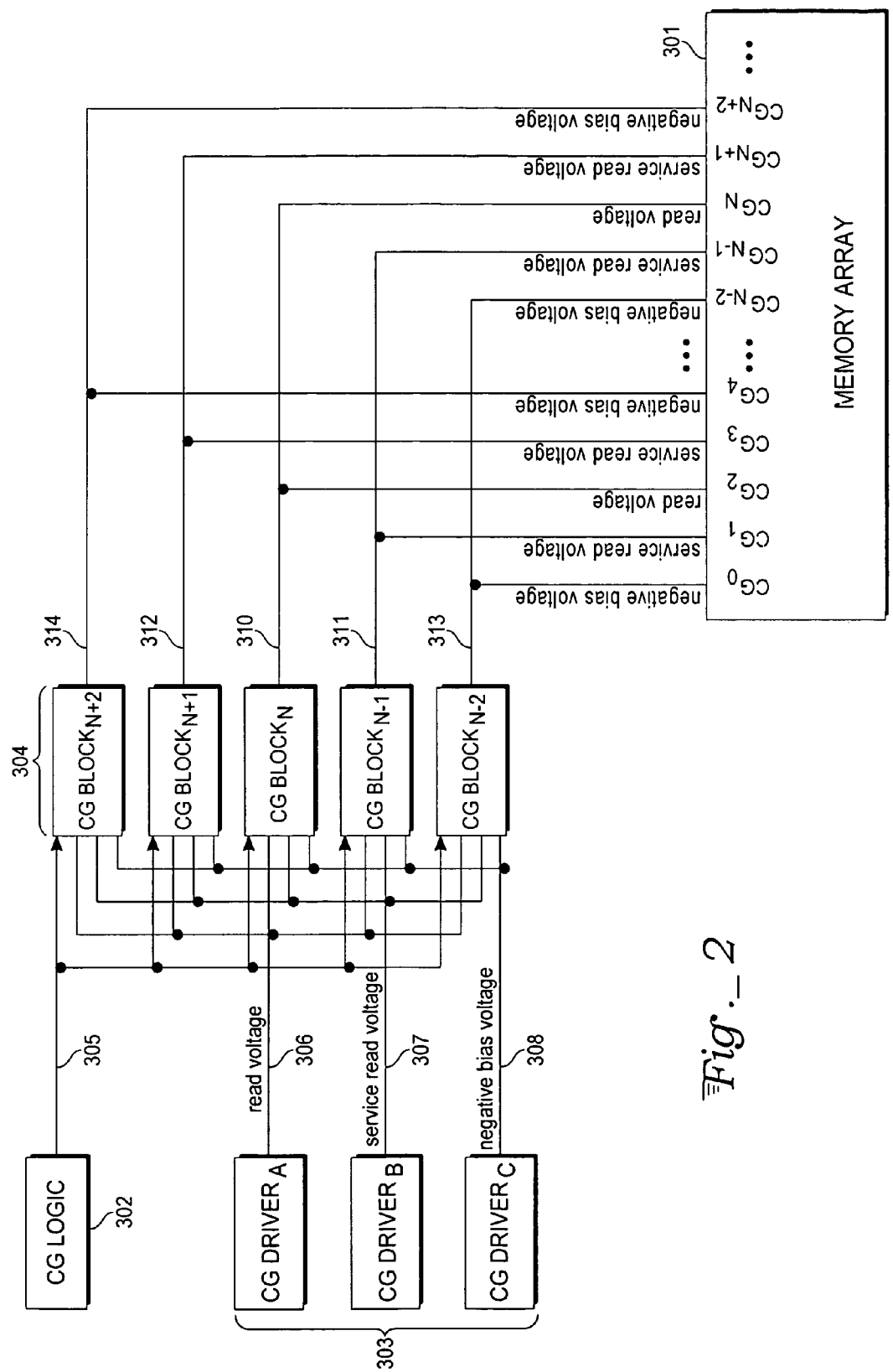
FIG. 2 is an exemplary block diagram of a control gate logic circuit that may be coupled to the MONOS memory array in FIG. 1.

Referring to FIG. 2, a control gate circuit applies or couples bias voltages to a memory cell control gate within a memory array 301. The memory array 301 is coupled to a plurality of control gate blocks CG Block 304 via a plurality of control gate lines 310–314. The plurality of control gate blocks CG Block 304 selectively couples a voltage source (such as a read voltage, a service read voltage, or a negative bias voltage) from a plurality of bias voltage drivers 303, to each control gate line 310–314. A control gate logic circuit CG Logic 302 activates or controls each CG Block 304, via a coupled control line(s) 305 which may be a single line or multiple lines.

Control gate lines 310–314 select or activate particular memory cells in a selected row for the purpose of performing a memory cell operation. A row of memory cells within the memory array 301 is generally selected or activated via word lines (not shown) and when a particular row has been selected via the word line, at least one memory cell within the row may then be selected to perform, for example, a read operation. A plurality of memory cells on a selected row may be targeted, and a negative bias voltage may be applied to a plurality of adjacent or proximate memory cells. In a read operation, voltages are applied to the memory cells to access stored logic states in target memory cells. When the memory cells are activated, bit lines and sense circuits (not shown) read the stored value in the target memory cells.

In an exemplary embodiment, a target memory cell (N) read operation is performed. For the exemplary twin MONOS memory array described above, bias voltages are applied to the target memory cell (N), adjacent memory units (or pairs), and proximate memory units (or pairs). A read voltage is applied to the target memory cell (N). The CG Logic circuit 302 activates a control gate block CG $Block_N$ to couple the read voltage line 306 from the bias voltage driver CG $Driver_A$ to the control gate line 310 and the target memory cell (N) control gate. A service read voltage is applied to the adjacent memory units. The CG Logic circuit 302 activates a control gate block CG $Block_{N-1}$, CG $Block_{N+1}$ to couple a service read voltage line 307 from the bias voltage driver CG $Driver_B$ to the control gate lines 311, 312 and the control gates of memory cells adjacent to the target memory cell (N). A negative bias voltage, that is lower than a threshold voltage of an over-erased memory cell, is applied to the proximate memory units. The CG Logic circuit 302 activates a control gate block CG $Block_{N-2}$, CG $Block_{N+2}$ to couple the negative bias line 308 from the bias voltage driver CG $Driver_C$ to the control gate lines 313, 314 and the control gates of memory cells proximate to the target memory cell (N).

Figure 3:
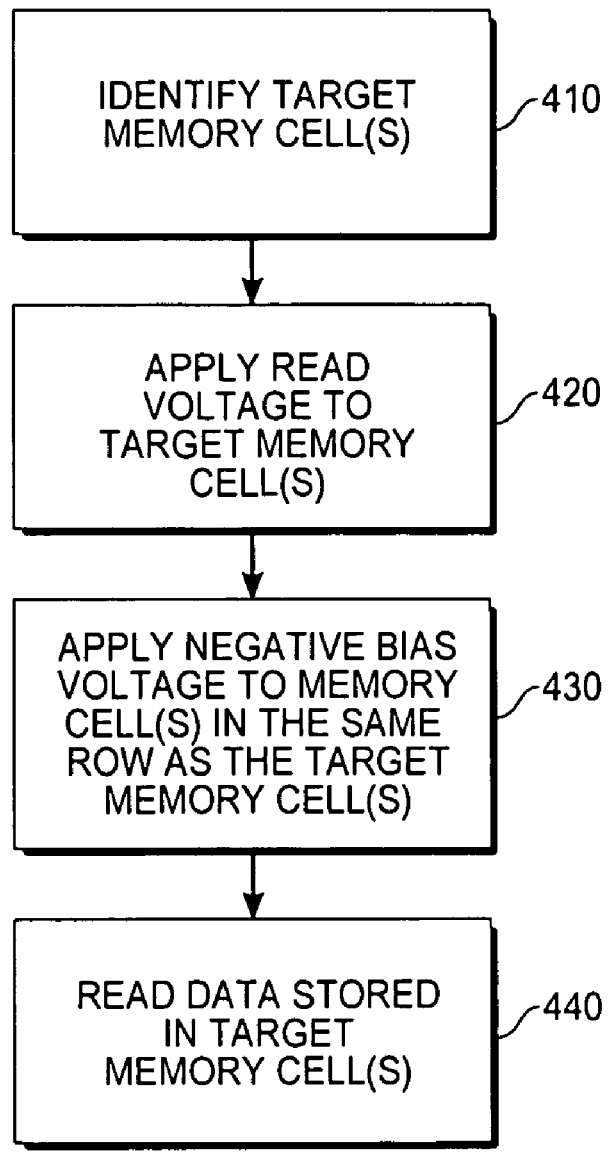
FIG. 3 is an exemplary flow chart for reading the target memory cell of FIG. 1.

In the above embodiment, either a read voltage, or select read voltage, or negative bias voltage is applied to a target memory cell and the memory cells adjacent and proximate to the target memory cell. Referring to FIG. 3, a target memory cell (or cells) from an array of memory cells arranged in rows and columns, is identified 410. For example, the target memory cell is activated by activating a word line to activate the target memory cell row, and activating a bit line to activate the target memory cell column. A read voltage is applied 420 to the target memory cell, for example, to the control gate of the target memory cell. For the exemplary dual MONOS structure in FIG. 1, a service read voltage is applied to memory cells that are adjacent to and in the same row as the target memory cell(s) (not shown). Applying a service read voltage is optional for other memory cell configurations. A negative bias voltage is applied 430 to other proximate memory cells that are in the same row as the target memory cell. The applied negative bias voltage will be less than the threshold voltage of an over-erased memory cell. The memory cells that the negative bias voltage is applied to may be adjacent to or may be proximate to (in the vicinity of) the target memory cell. Applying the negative bias voltage will ensure that adjacent or proximate memory cells are shut off, even if an over-erased condition exists, providing improved reliability for target memory cell operations, such as when data are read 440 in target memory cells. In alternative embodiments, for example for other memory configurations, a read voltage is applied to a target memory cell and a negative bias voltage is applied to adjacent or proximate memory cells.

The present invention applies negative bias voltages to selected cells in the same memory array row as a targeted memory cell. The application of a negative bias voltage to memory cells that are adjacent to or proximate to the target memory cell ensures that the adjacent and/or proximate memory cells will be shut off during a read or program operation. Shutting off adjacent or proximate memory cells isolates current that may come from adjacent cells that are over erased. Generally, the applied negative bias voltage is below or less than an over-erased memory cell threshold voltage. Control gate circuits apply the voltages to isolate and protect an addressed, selected, or target memory cell from an undesired flow charge or current from an over-erased memory cell. Although the bias conditions for a MONOS memory array and memory cell configuration have been exemplified above, the present invention may be similarly applied to other memory configurations.

Embodiments described herein are intended to cover any adaptations or variations that embody the present invention. Those of skill in the art will recognize that the invention can be practiced with modification and alteration within the spirit and scope of the appended claims and many other embodiments will be apparent to those of skill in the art upon reading and understanding the above description. For example, memory circuits other than a twin MONOS configuration may be used, and the memory cells may be fabricated or operated to store multiple bits or multiple logic states for each memory cell. Additionally, for other memory array configurations, a read voltage may be applied to a target memory cell and a negative bias voltage may be applied to adjacent or proximate memory cells without applying a service read voltage. Other threshold voltages, read voltages, erase voltages, or program voltages may also be used without departing from the spirit or scope of the present invention.

What is claimed is:

1. A nonvolatile memory device comprising:
    a plurality of memory cells arranged in an array of rows and columns, each of the plurality of memory cells further comprising at least one control gate;
    a plurality of control gate circuits coupled to each of said memory cell control gates; and
    a read voltage driver coupled to said plurality of control gate circuits and a negative bias voltage driver coupled to said plurality of control gate circuits, said plurality of control gate circuits configured to selectively couple said read voltage voltage driver to at least one target memory cell control gate in at least one selected row, said plurality of control gate circuits configured to selectively couple said negative bias voltage driver to at least one memory cell control gate in each of said at least one selected row as said at least one target memory cell.

2. The memory device of claim 1 wherein each of said plurality of control gate circuits further comprise a control gate logic circuit and a control gate block.

3. The memory device of claim 1 wherein each of said plurality of control gate circuits is further configured to selectively couple said negative bias voltage driver to at least one memory cell control gate that is adjacent to said target memory cell.

4. The memory device of claim 1 wherein each of said plurality of control gate circuits is further configured to selectively couple said negative bias voltage driver to at least one memory cell control gate that is proximate to, but not adjacent to, said target memory cell.

5. The memory device of claim 1 further comprising at least one service read voltage driver.

6. The memory device of claim 5 wherein each of said plurality of control gate circuits is further configured to selectively couple said service read voltage driver to at least one memory cell control gate that is adjacent to at least one target memory cell.

7. The memory device of claim 5 wherein each of said plurality of control gate circuits is further configured to selectively couple said service read voltage driver to at least one memory cell control gate that is adjacent to and in each of said at least one selected row as said at least one target memory cell; and
    each of said plurality of control gate circuits is configured to selectively couple said negative bias voltage driver to at least one memory cell control gate in each of said at least one selected row, and proximate to said at least one target memory cell.

8. The memory device of claim 1 further comprising a word line coupled to said plurality of memory cells, said word line configured to activate or select a row of memory cells.

9. The memory device of claim 1 wherein said negative bias voltage driver provides a voltage below or less than a threshold voltage of an over-erased memory cell.

10. A nonvolatile memory device comprising:
    a plurality of twin MONOS memory units arranged in an array of rows and columns, each of the plurality of twin MONOS memory units including a plurality of memory cells, said plurality of memory cells each having a corresponding memory cell control gate;
    a plurality of control gate circuits correspondingly coupled to said memory cell control gates;
    a read voltage driver;
    a service read voltage driver;
    a negative bias voltage driver; and
    said plurality of control gate circuits configured to selectively couple said read voltage driver to at least one target memory unit, said plurality of control gate circuits further configured to selectively couple said service read voltage driver to at least one other memory unit that is adjacent to and in a same row as said at least one target memory unit, said plurality of control gate circuits further configured to selectively couple said negative bias voltage driver to at least one other memory unit that is proximate to and in the same row as said at least one target memory unit.

11. The memory device of claim 10 further comprising a word line coupled to said plurality of twin MONOS memory units, said word line configured to activate or select a row of twin MONOS memory units.

12. The memory device of claim 10 wherein said negative bias voltage driver provides a voltage below or less than a threshold voltage of an over-erased memory cell.

13. A method of reducing an effect of over-erased nonvolatile memory cells, the method comprising:
 arranging a plurality of nonvolatile memory cells having control gates in an array of rows and columns;
 applying a read voltage to at least one target memory cell control gate; and
 applying a negative bias voltage to at least one memory cell control gate that is proximate to and in a same row as said at least one target memory cell.

14. The method of claim 13 wherein applying said negative bias voltage is applied to said at least one memory cell control gate that is adjacent to said at least one target memory cell.

15. The method of claim 13 wherein a negative bias voltage is applied to said at least one memory cell control gate that is proximate to, but not adjacent to, said at least one target memory cell.

16. The method of claim 13 further comprising the step of applying a service read voltage to at least one other memory cell control gate that is adjacent to and in the same row as said at least one target memory cell.

17. The method of claim 13 further comprising the step of activating a word line to select a row of memory cells.

18. The method of claim 13 wherein applying a negative bias voltage applies a voltage that is below or less than a threshold voltage of an over-erased memory cell.

19. The method of claim 13 wherein applying a negative bias voltage to at least one memory cell control gate shuts off at least one over-erased memory cell.

* * * * *